United States Patent
Achanta et al.

(10) Patent No.: US 10,192,772 B2
(45) Date of Patent: Jan. 29, 2019

(54) SUBSTRATE TABLE AND LITHOGRAPHIC APPARATUS

(71) Applicant: ASML NETHERLANDS B.V., Veldhoven (NL)

(72) Inventors: Satish Achanta, Leuven (BE); Tiannan Guan, Best (NL); Raymond Wilhelmus Louis LaFarre, Helmond (NL); Ilya Malakhovsky, Eindhoven (NL); Bas Johannes Petrus Roset, Eindhoven (NL); Siegfried Alexander Tromp, Knegsel (NL); Johannes Petrus Martinus Bernardus Vermeulen, Leende (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/766,740

(22) PCT Filed: Sep. 8, 2016

(86) PCT No.: PCT/EP2016/071139
§ 371 (c)(1),
(2) Date: Apr. 6, 2018

(87) PCT Pub. No.: WO2017/060028
PCT Pub. Date: Apr. 13, 2017

(65) Prior Publication Data
US 2018/0308740 A1 Oct. 25, 2018

(30) Foreign Application Priority Data

Oct. 9, 2015 (EP) ..................................... 15189177
Mar. 17, 2016 (EP) ..................................... 16160992

(51) Int. Cl.
*G03F 7/20* (2006.01)
*H01L 21/687* (2006.01)
(Continued)

(52) U.S. Cl.
CPC ...... *H01L 21/68742* (2013.01); *G03F 7/0002* (2013.01); *G03F 7/707* (2013.01);
(Continued)

(58) Field of Classification Search
CPC ........ G03F 7/0002; G03F 9/7003; G03F 1/20; G03F 1/42; G03F 1/50; G03F 1/68
See application file for complete search history.

(56) References Cited

U.S. PATENT DOCUMENTS

| | | |
|---|---|---|
| 5,923,408 A | 7/1999 | Takabayashi |
| 2005/0263077 A1 | 12/2005 | Ganapathisubramanian et al. |

(Continued)

FOREIGN PATENT DOCUMENTS

KR 2005-277117 10/2005

OTHER PUBLICATIONS

International Search Report and Written Opinion dated Dec. 7, 2016 in corresponding International Patent Application No. PCT/EP2016/071139.

*Primary Examiner* — Michelle M Iacoletti
(74) *Attorney, Agent, or Firm* — Pillsbury Winthrop Shaw Pittman LLP (57) ABSTRACT

A substrate table to support a substrate, the substrate table including a main body, burls extending from the main body and having first upper ends that define a support surface to support the substrate, and support pins having second upper ends. The support pins are movable between a retracted position and an extended position. The support pins are arranged to support the substrate in the extended position. The support pins are arranged to be switched to a first (Continued)

stiffness mode and a second stiffness mode. In the first stiffness mode, the support pins have a first stiffness in a direction parallel to the support surface. In the second stiffness mode, the support pins have a second stiffness in the direction parallel to the support surface. The first stiffness is different from the second stiffness.

20 Claims, 5 Drawing Sheets

(51) Int. Cl.
*H01L 21/683* (2006.01)
*G03F 7/00* (2006.01)

(52) U.S. Cl.
CPC ...... *G03F 7/70708* (2013.01); *G03F 7/70716* (2013.01); *G03F 7/70725* (2013.01); *G03F 7/70733* (2013.01); *G03F 7/70783* (2013.01); *H01L 21/683* (2013.01); *H01L 21/687* (2013.01); *H01L 21/6831* (2013.01); *H01L 21/6875* (2013.01)

(56) References Cited

U.S. PATENT DOCUMENTS

| | | |
|---|---|---|
| 2008/0291411 A1 | 11/2008 | Phillips |
| 2013/0222782 A1 | 8/2013 | Kasa et al. |

According to an embodiment of the invention, there is provided a lithographic apparatus comprising: an illumination system configured to condition a radiation beam; a patterning device support constructed to support a patterning device, the patterning device being capable of imparting the radiation beam with a pattern in its cross-section to form a patterned radiation beam;
a substrate table as mentioned above; and a projection system configured to project the patterned radiation beam onto a target portion of the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
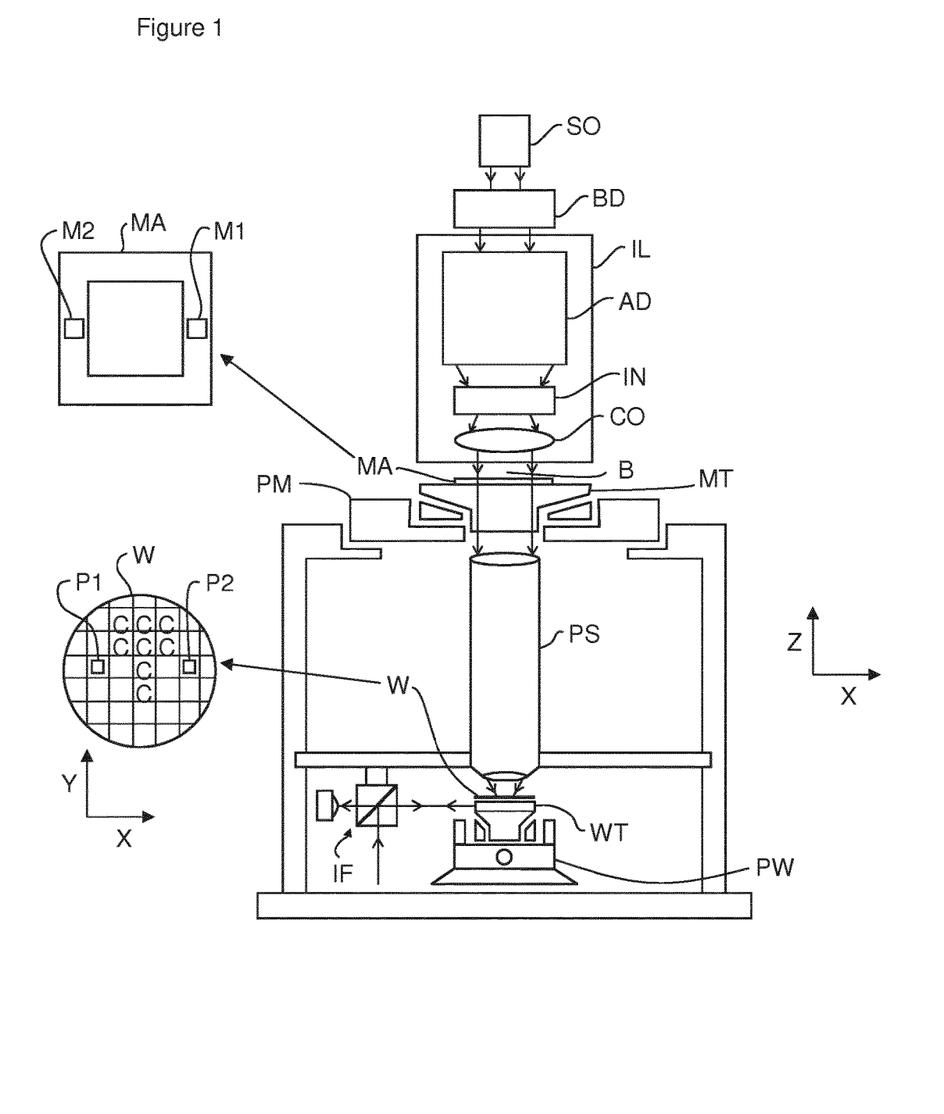
FIG. 1 depicts a lithographic apparatus comprising a substrate table according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The term "radiation beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The illumination system may include various types of optical components, such as refractive, reflective, magnetic, electromagnetic, electrostatic or other types of optical components, or any combination thereof, for directing, shaping, or controlling radiation.

The patterning device MT support supports, i.e. bears the weight of, the patterning device MA. It holds the patterning device MA in a manner that depends on the orientation of the patterning device MA, the design of the lithographic apparatus, and other conditions, such as for example whether or not the patterning device MA is held in a vacuum environment. The patterning device support MT can use mechanical, vacuum, electrostatic or other clamping techniques to hold the patterning device MA. The patterning device support MT may be a frame or a table, for example, which may be fixed or movable as required. The patterning device support MT may ensure that the patterning device MA is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion C of the substrate W. It should be noted that the pattern imparted to the radiation beam may not exactly correspond to the desired pattern in the target portion C of the substrate W, for example if the pattern includes phase-shifting features or so called assist features. Generally, the pattern imparted to the radiation beam will correspond to a particular functional layer in a device being created in the target portion C, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the radiation source SO is an excimer laser. In such cases, the radiation source SO is not considered to form part of the lithographic apparatus and the radiation beam is passed from the radiation source SO to the illuminator IL with the aid of a beam delivery system BD including, for example, suitable directing mirrors and/or a beam expander. In other cases the source may be an integral part of the lithographic apparatus, for example when the source is a mercury lamp. The radiation source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device MA, which is held on the patterning device support MT, and is patterned by the patterning device MA. Having traversed the patterning device MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device MA with respect to the path of the radiation beam B, e.g. after mechanical retrieval from a mask library, or during a scan. In general, movement of the patterning device support MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioner PW. In the case of a stepper (as opposed to a scanner) the patterning device support MT may be connected to a short-stroke actuator only, or may be fixed. Patterning device MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the mask alignment marks may be located between the dies.

The depicted apparatus could be used in at least one of the following modes:

1. In step mode, the patterning device support MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support MT and the substrate table WT are scanned synchronously while a pattern imparted to the radiation beam is projected onto a target portion C (i.e. a single dynamic exposure). The velocity and direction of the substrate table WT relative to the patterning device support MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support MT is kept essentially stationary holding a programmable patterning device MA, and the substrate table WT is moved or scanned while a pattern imparted to the radiation beam is projected onto a target portion C. In this mode, generally a pulsed radiation source SO is employed and the programmable patterning device MA is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 3:
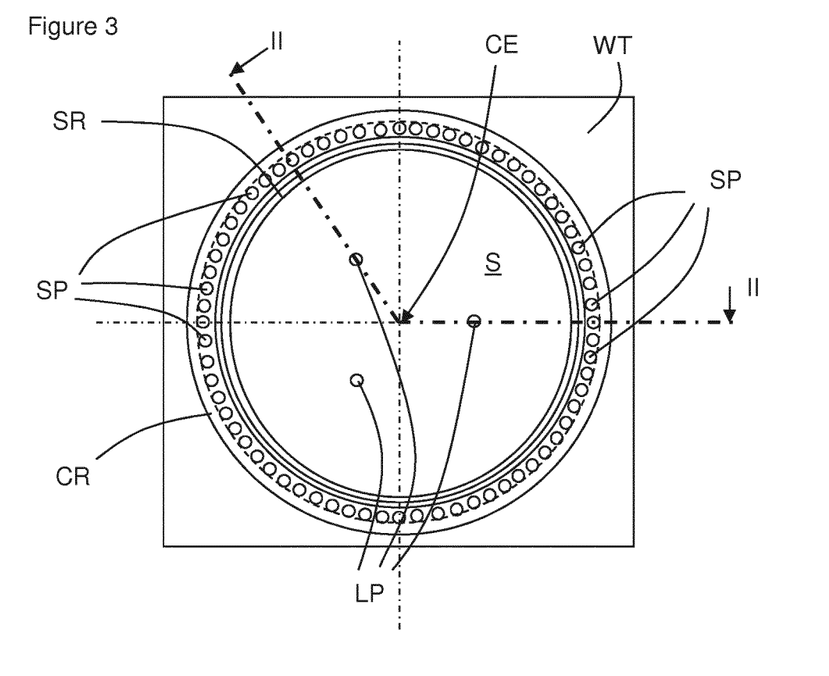
FIG. 3 depicts a top view of the substrate table of FIG. 2.
Figure 4:
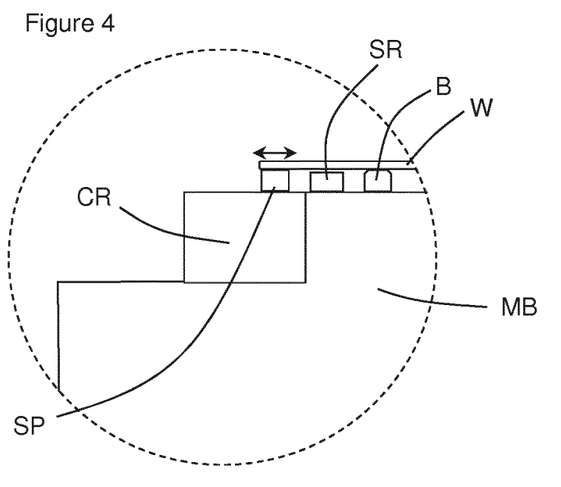
FIG. 4 depicts a detail A of the embodiment of FIG. 2.

The lithographic apparatus comprises a substrate table WT. An upper part of the substrate table WT is shown in more detail in FIGS. 2 and 3 in cross-section and top view, respectively. FIG. 4 shows a detail A of the substrate table WT of FIG. 2 supporting a substrate W.

Figure 2:
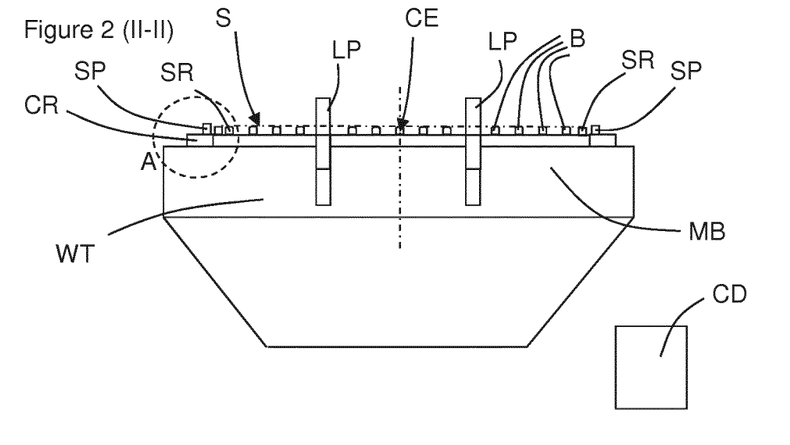
FIG. 2 depicts a cross section (II-II) of an embodiment of a substrate table of a lithographic apparatus.

The substrate table WT comprises a main body MB and a plurality of burls B extending from the main body MB to a supporting height to define a support surface S. The support surface S is configured to support the substrate W on the substrate table WT. During manufacture of the substrate table WT, the burls B are machined and polished with high precision to obtain a flat support surface S. Typically, the support surface S is a horizontal surface. The burls B limit the surface area of contact between the substrate table WT and the substrate W so as to prevent contamination on the substrate table WT or on the bottom of the substrate W to affect the substrate W when the substrate is supported on the support surface S.

Further, the space between the burls B at the outer region of the substrate table WT is delimited by a sealing ring SR that may be used to create an underpressure to clamp the substrate W on the support surface S, in particular on the upper ends of the burls B. In other embodiments, such sealing ring SR may not be present, for example in a lithographic apparatus in which an electrostatic clamp is used to clamp the substrate W on the substrate support WT. When the substrate W is supported on the support surface S, there may a gap between the sealing ring SR and the substrate W. Alternatively, there is no gap and the sealing ring SR is in contact with the substrate W when the substrate W is supported on the support surface S. The top surface of the sealing ring SR may form part of the support surface S.

The substrate table WT is configured to receive the substrate W at a predefined area on the support surface S. This predefined area is indicated by a dashed circle in FIG.

3. This predefined area comprises a center CE. This center CE will receive the center of a substrate W to be placed on the substrate table WT.

To load the substrate on the substrate table WT and to unload the substrate W from the substrate table WT, the substrate table WT is provided with a set of loading pins LP configured to receive and support the substrate W.

In the example shown, the set of loading pins LP comprises three pins extending substantially vertically and being arranged so as to form the vertices of an equilateral triangle centered on the center CE. Each loading pin LP is movable between a first retracted position and a first extended position. In the first retracted position, an upper end of the loading pin LP is arranged below the support surface S. In the first extended position, the upper end of the loading pin LP extends above the support surface S. In FIG. 2, the loading pins LP are shown in the extended position.

The substrate table WT comprises a set of support pins SP configured to support the substrate W. Each support pin SP, or at least its upper end, is movable between a second retracted position and a second extended position. In the second retracted position, an upper end of the support pin SP is arranged below the support surface S. In the second extended position, the upper end of the support pin SP extends above the support surface S. In FIG. 2 the support pins SP are shown in the extended position.

The upper ends of the support pins SP may have a small displacement between the second retracted position and the second extended position. The displacement of the upper ends of the support pins SP between the second extended position and the second retracted position may be small. For example, the distance between the second extended position and the second retracted position is smaller than the distance between the first extended position and the first retracted position. In the shown embodiment, the support pins SP comprise piezo-elements of which the height can be changed in dependence of an voltage being applied to the piezo-element.

The support pins SP are distributed along an outer edge of the supporting surface S to support an edge area of a substrate W arranged on the support surface S. The support pins SP are arranged around the burls B defining the support surface S.

The support pins SP may be arranged in a circle around the burls B, the circle having a constant radius with respect to the centers CE.

FIG. 3 shows schematically a number of support pins SP, but in practice, the number of support pins SP arranged may be substantially higher. Preferably the number of support pins SP arranged around the burls B is at least 50, for example between 250 and 500 support pins SP. The pitch between the individual support pins SP may be in the range of 1-5 mm, for example 1.5 mm or 2.5 mm.

The dimensions of a support pin SP may be substantially correspond to the dimensions of a burl B. The support pins SP are preferably made of PZT material (lead zirconate titanate) or any other suitable piezo material.

The support pins SP may be arranged on a carrier device. For example, the support pins SP are arranged on an annular carrier ring CR that is releasably mounted on the main body MB of the substrate stage WT. The carrier ring CR is releasably mounted to allow the manufacturing of the carrier ring CR including the support pins SP to be separate from the manufacturing of the main body BD. This is for example advantageous when the main body MB is made of ceramic material that requires sintering at high temperatures which are not suitable for the support pins SP. Furthermore, if the support pins SP malfunction, the carrier ring CR with support pin SP may be replaced without the need of providing a completely new substrate table WT.

The carrier ring CR may for example be mounted on the substrate table WT by contact bonding or optical bonding. Any other suitable method to releasably mount the carrier ring CR on the substrate table WT may also be used.

Further, it is remarked that the carrier ring CR may be assembled by a number of ring segments, for example four ring segments, each ring segment extending over a quarter of the circumference of the support surface S. Alternatively, the carrier device is not formed as the carrier ring CR, but has another suitable shape. For example, the carrier device may be square or rectangular.

The support pins SP may be fabricated as MEMS devices, in particular MEMS PZT devices. The advantage of using MEMS technology to manufacture the support pins SP is that the support pins SP may be manufactured in a batch fabrication. Such batch fabrication may take away the need to assemble individual support pins SP onto the carrier ring CR.

For example, the support pins SP may be fabricated in a ring configuration on the outer edge area of a substrate W. When fabrication is finished the outer edge area of the substrate W can be cut from the substrate W to form the annular carrier ring CR having a plurality of supporting pins SP. This annular carrier ring CR may be mounted on the substrate table WT by either optical contact or anodic bonding or eutectic bonding.

The support pins SP, or at least the upper ends, may be designed to have a low friction with a substrate W supported thereon compared with the friction between an upper end of a burl B and the same substrate W. Since the friction between the substrate W and the upper end of the support pins SP is smaller, the substrate W will more easily slide over the upper ends of the support pins SP than over the upper ends of the burls B.

An important advantage of the support pins SP is that they can be used during the loading and unloading of substrate W on and from the substrate table WT, respectively, in order to reduce wear of the burls B, in particular the burls B near the outer circumference of the support surface S.

When a substrate W is to be loaded on the support surface S, the loading pins LP are arranged in the extended position, as shown in FIG. 2. When the loading pins LP have received a substrate W from a substrate loading device, for instance a loading robot, the loading pins LP can be lowered to bring the substrate W towards support surface S.

When no support pins SP would be present on the substrate table WT, the substrate W would directly be arranged on the burls B, when the loading pins LP would be lowered to arrange the substrate W on the substrate support S. This means that in particular the outer burls B would first come into contact with the substrate W due to the gravity sag of the substrate W.

However, since the support pins SP are present in the shown embodiment of the substrate table WT, the support pins SP can be arranged in the extended position before loading the substrate W on the support surface S. When the loading pins LP supporting a substrate W are then lowered towards the supporting surface S, the outer edge of the substrate W first comes to rest on the supporting pins SP.

Since there is a relatively low friction between the upper ends of the support pins SP and the substrate W, the substrate W will more easily slide over the upper ends of the support pins SP with the result that no or less internal stresses are introduced into the substrate W when being placed on the support surface S. Once the substrate W is arranged close to or on the upper ends of the burls B, the support pins SP can be moved to the retracted position. The substrate W will then be supported by the burls B. Since there is a relatively large friction between the burls B and the substrate W, the burls B can hold, together with a clamping device, for example a vacuum clamp and/or electrostatic clamp, the substrate W firmly on the support surface S.

Furthermore, wear of the burls B is avoided, since the substrate W does not slide over the upper ends of the burls B. Thereby, it is remarked that since the height of the upper ends of the support pins SP can be adjusted, when needed, by the actuation of the piezo-elements of the support pins SP. Thus, any wear of the upper ends of the support pins SP can be adjusted by adjusting the actuation voltage of the respective piezo-element. In this way it is avoided that after some wear of the support pins SP, the substrate W would again come first into contact with the burls B and/or that the carrier ring CR has to be replaced.

To minimize wear of at least the upper ends of the support pins SP, the support pins SP may be coated with a wear resistant coating, such as diamond like carbon or a SiC coating. The support pins SP can also be manufactured from a more wear-resistant material than the material of the burls B.

A control device CD may be configured to adapt the height of the upper ends of the support pins SP by applying a suitable voltage to the piezo-elements. The control device CD may be arranged in the substrate table WT but also at another position. The control device CD may for example be part of a central processing unit of the lithographic apparatus.

The control device CD may be configured to control the height of the upper ends of the support pins SP individually or in groups.

During loading of a substrate W on the substrate table it is advantageous that the support pins SP are relatively stiff in the radial direction of the support surface S, or more generally in the plane of the support surface S, since this will facilitate the sliding of the substrate W over the burls B. As explained above, this sliding decreases the introduction of internal stresses and/or internal forces in the substrate W during loading of the substrate W.

However, when a substrate W is unloaded from the substrate table WT, it is advantageous that the support pins SP are relatively flexible in the plane of the support surface S. During unloading of the substrate W, the release from the vacuum clamp and the lifting of the substrate W by the loading pins LP, will make the substrate W returning to its original shape, i.e. the shape before clamping of the substrate W on the support surface S. When the support pins SP are relatively stiff in the plane of the support surface S, the substrate W would slide over the support pins SP, which could cause wear to the substrate W, and possibly also could cause contamination.

To avoid this wear of the bottom surface of the substrate W and/or contamination, the stiffness of the support pins SP can be switched to a first stiffness mode and a second stiffness mode. In the first stiffness mode the support pins SP have a first stiffness in a direction parallel to the support surface S and in the second stiffness mode the support pins SP have a second stiffness in the direction parallel to the support surface S. The first stiffness is different from the second stiffness. In an embodiment, the first stiffness is larger than the second stiffness. In another embodiment, the first stiffness is smaller than the second stiffness.

In the first stiffness mode, the support pins SP may support the substrate W with the first stiffness in the direction parallel to the support surface S. In the second stiffness mode, the support pins SP may support the substrate W with the second stiffness in the direction parallel to the support surface S.

The support pins SP may comprise piezo-elements that is arranged to switch between the first stiffness mode and the second stiffness mode by applying a different voltage to the respective piezo-elements in the first stiffness mode and the second stiffness mode.

When the first stiffness is larger than the second stiffness, during loading of a substrate the support pins SP are configured to be arranged in the first stiffness mode with relatively high stiffness. The substrate W will relatively easily slide over the upper ends of the support pins SP. During unloading of a substrate, the support pins SP are arranged in the second stiffness mode with a relatively low stiffness. In the second stiffness mode the upper end of the support pins SP is more flexible to move in the plane of the support surface S as indicated by a double headed arrow in FIG. 4.

When the substrate W is released from the clamp device and lifted by the loading pins LP, a shape change of the substrate W in the plane of the support surface S can at least partially be followed by the flexible support pins SP. As a result, wear of the bottom surface of the substrate W and/or the upper ends of the support pins SP may be reduced or even avoided.

The switching between the first stiffness mode and the second stiffness mode may for example be controlled by the control device CD. The control device CD may control the piezo-element to switching between the first stiffness mode and the second stiffness mode.

In an alternative embodiment, the set of support pins SP of the substrate table WT is subdivided in first subset of support pins SP and second subset support pins SP that are alternately arranged along the outer edge area of the support surface S to support an edge area of the substrate W during loading and unloading.

The first subset of support pins SP has a relatively high stiffness in the plane of the support surface S, while the second subset of support pins SP has a relatively low stiffness in the plane of the support surface S. Therefore, the first subset of support pins SP is more suitable to support the edge of the substrate W during loading of the substrate W onto the support surface S, whereas the second subset of support pins SP is more suitable to support the edge of the substrate W during unloading of the substrate W from the support surface S.

In this embodiment, the control device CD is configured to move the first subset of support pins SP to the second extended position before loading of the substrate W on the support surface S. The second subset of support pins SP remains or is moved to the second retracted position. Before unloading of the substrate W from the support surface S, the second subset of support pins SP are moved to the second extended position while the first subset of support pins SP remains in or is moved to the second retracted position.

In an embodiment, during load of the substrate W on the support surface S, both the first subset of support pins SP and the second subset of support pins SP are used to support the substrate W. During unload of the substrate W from the support surface S, only one of the first subset of support pins SP and the second subset of support pins SP are used to support the substrate W. Because more support pins SP are used during loading of the substrate W than during unloading of the substrate W, the support pins SP provide more stiffness during loading than during unloading.

FIG. 4 shows a detail A of the substrate table WT of FIG. 2, wherein the substrate W is supported on the support surface S. It can be seen that the substrate W is not only supported by the burls B, but also by the support pins SP. This additional support of the edge of the substrate W during the actual projection step may be used to improve the shape of the substrate W during projection, in particular to correct for substrate edge curl up or substrate edge curl down of the substrate.

To determine the desired height for each of the support pins SP, the upper surface of the substrate W after is has been loaded on the substrate table WT may be scanned by a so-called level sensor. This level sensor provides a height map of the clamped substrate W. During this scanning step the substrate W may already be supported by the support pins SP. Once this height map is known, a curl up or curl down of the edge of the substrate W can be corrected by adapting the height of the support pins SP to the desired correction of the respective edge part of the substrate W.

The height of the support pins SP may be changed by the control device CD, which may adjust the voltage applied to the respective piezo-element or group of piezo-elements. Once the edge of the substrate W has been adapted to the desired height by adjusting the height of the support pins SP on the basis of the height map, the actual projection of the patterned projection beam on the substrate W may be started.

In an alternative embodiment, adjustment of the height of the support pins can be carried out directly after that the control device CD determines that a height level of a substrate W at a location supported by the respective support pin SP is different than the desired height level of the substrate at that location. The height level of the substrate may be determined by a level/height sensor and the control device CD may be configured to directly determine a difference between the desired height level and the measured height level once a signal is received from the level/height sensor.

Figure 5:
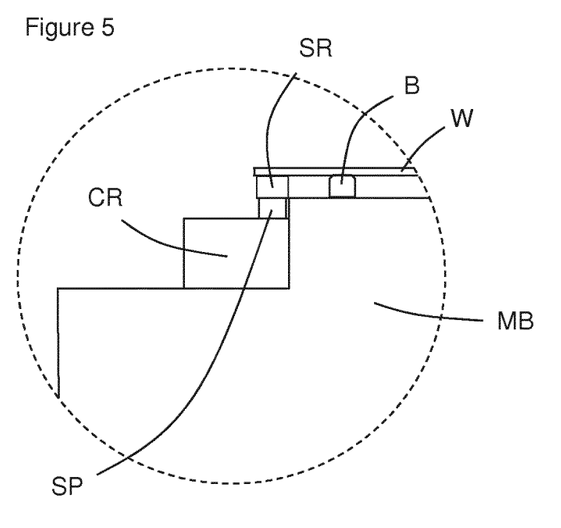
FIG. 5 depicts a first alternative embodiment of a substrate table according to the invention.

FIG. 5 shows an alternative embodiment of the substrate table WT. In this embodiment, the support pins SP are arranged at the circumference of the support surface S to support the wafer W. The support pins SP carry a sealing ring SR. The sealing ring SR is provided to delimit a vacuum space of a vacuum clamp to clamp the substrate W on the substrate table WT.

In the embodiment of FIGS. 2 and 3, the sealing ring SR is mounted on the main body MB of the substrate table WT and extends to a smaller height than the burls B to avoid that the sealing ring SR contacts the substrate W during the projections step, as such contact may adversely affect the shape of the substrate W during projection. Alternatively, the sealing ring SR contacts the substrate W during the projections step.

Figure 6:
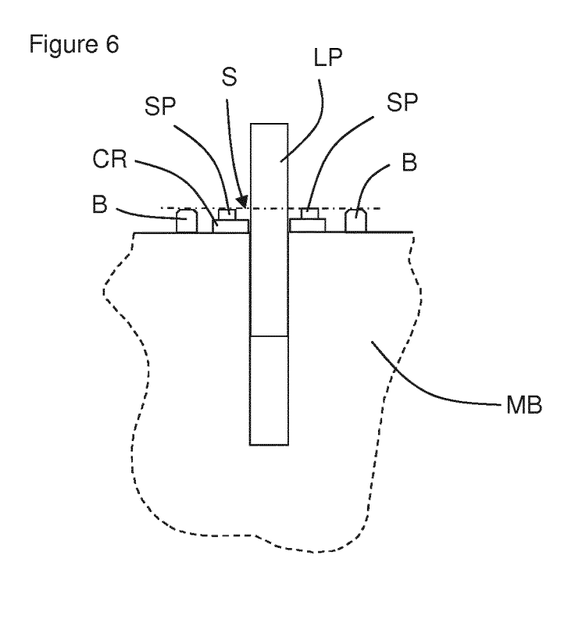
FIG. 6 depicts a further embodiment of a substrate table according to the invention.

Since the height of the sealing ring SR of the embodiment of FIG. 6 can be adjusted by adjusting the height of the piezo-elements of the support pins SP, the sealing ring SR may be arranged very close to the substrate W or even in contact with the substrate W during projection of a patterned beam on a target portion C of the substrate W. This reduces pressure leakage of the vacuum clamp between the sealing ring SR and the substrate W. Further, since the support pins SP and the sealing ring SR are provided in combination at a single diameter of the support surface S, the vacuum clamp space of the vacuum clamp may be increased.

In this embodiment, the desired height of each of the support pins SP can be determined on the basis of the height map obtained by a level sensor in order to position the sealing ring SR in the desired height with respect to the substrate W. In an alternative embodiment real-time correction of the height of the support pins SP can be carried out on the basis of height levels measured by the level sensor.

The position of the sealing ring SR with respect to the edge of the substrate W may also be used to correct curl up or curl down of the edge of the substrate W during projection of a patterned beam on the substrate W.

FIG. 6 shows a further embodiment of a substrate table WT according to the invention. In this embodiment, a carrier ring CR with support pins SP is arranged around a loading pin LP. The support pins SP can be used, similarly to the support pins of SP of the embodiment of FIG. 2, to at least support the substrate W during loading of the substrate W on the support surface S and unloading of the substrate W from the support surface S.

The combination of carrier ring CR and support pins SP may also be used to support a sealing ring as shown in FIG. 5 at the outer edge of the support surface.

The support pins SP are adjacent to the loading pins SP and may be used as a number of additional support pins SP in combination with support pins SP at other suitable locations, in particular with the support pins SP at the edge of the support surface S as shown in FIGS. 2 and 3, to improve loading and/or unloading the substrate W on/from the support surface S and/or to support the substrate during the projection step.

Figure 7:
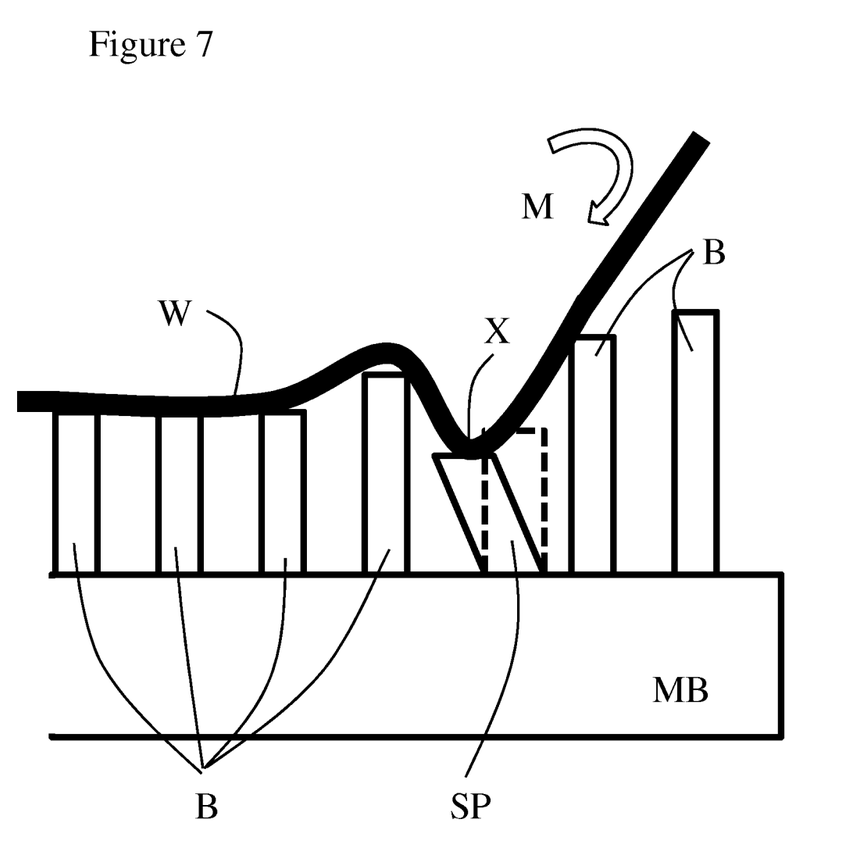
FIG. 7 depicts yet another embodiment of a substrate table according to the invention.

Along a line in the support surface S, the support pins SP may be located at a larger radius from the center CE than the burls B. Along a line in the support surface S, the loading pins LP may be closer to the center CE than the support pins SP. The support pins SP may be located at the edge of the substrate W, such that the support pins SP can support the substrate W at the edge of the substrate W. Alternatively, as shown in the embodiment of FIG. 7, the support pins SP are near the edge of the support surface S and some burls B are at a larger radius from the center C than the support pins SP. Along the radius, there may be less than 10 burls or less than 5, for example 1, 2 or 3 burls B, between the edge of the support surface S and the support pins SP.

The support pins SP may be covered using a cover. Covering the support pins SP with a cover may help to protect the support pins SP against contamination and/or against liquid, such as immersion liquid. The cover may be applied over an individual support pin SP. A single cover may be applied over multiple support pins SP. For example, the cover may comprise a surface enclosing the support pins SP between the carrier ring CR and the cover. The cover may be applied to the entire support surface S or on only part of the support surface S. The cover may be comprise any suitable material, such as a ceramic, a polymer, aluminum oxide, glass etc. The cover may comprise a coating, such as a thin film coating.

In addition or alternative to a piezo-element, a support pin SP may comprise another type of actuator. For example, the support pin SP may comprise an hydraulic actuator or pneumatic actuator. The hydraulic actuator or the pneumatic actuator may use a pressurized fluid to move the upper end of the support pin SP between the second retracted position and a second extended position. The pressurized fluid may comprise a gas, a liquid or a combination of gas and liquid.

The substrate table WT may be arranged with additional loading pins arranged, along a line in the support surface S, between the loading pins LP and the support pins SP. The additional loading pins may have a larger moving range than the support pins SP. The movement range of the additional loading pins may be about 1 mm or 0.5 mm or 0.1 mm. There may be 3-12 additional loading pins, for example, 5 or 9 or 10. When loading a substrate W onto the substrate table WT, the substrate W is first supported by the loading pins LP. When the loading pins LP lower the substrate W toward the support surface S, the substrate W contacts the additional loading pins. The additional loading pins may support the substrate W closer to the edge of the substrate W than the loading pins LP. When the substrate W is supported by the loading pins LP and the additional loading pins, the substrate W may be flattened by movement of the loading pins LP and the additional loading pins, e.g., movement in vertical direction. After the substrate W has been flattened, the substrate W is lowered further toward the support surface S so the substrate W contacts the support pins SP. Using the additional loading pins may help to load a substrate W that has an unflat shape.

The embodiment as disclosed in FIG. 7 may have all the features as described above. In addition or alternatively, the stiffness of the burls B may have a larger stiffness than the support pins SP. This may be especially advantageously when a substrate W is loaded that is bowl shaped. As shown in FIG. 7, the edge of the substrate W is curved up due to the bowl shape. When loading the substrate W onto the substrate support WT, a moment of force M is needed to flatten the substrate W. Experiments indicate that the moment of force M causes a high reaction force at a location X, which is a few burls B radially inward from the edge of the support surface S. If there is a burl B at location X, the high reaction force would cause a high friction force, preventing the substrate W from sliding at that burl B. The prevention of sliding causes the substrate W to have large in-plane deformation. In the embodiment of FIG. 7, however, a support pin SP is located where the high reaction force would occur. Since the support pin SP has a lower in-plane stiffness than the in-plane stiffness of the burls B, the support pin SP is able to deform radially, allowing the substrate W to reduce stress. The stiffness of the support pin SP may be a factor of 2, 4, 5, 10 or 20 times lower than the stiffness of the burl B.

The support pin SP may have a lower axial stiffness, i.e., stiffness in the vertical direction, than the burls B. The support pin SP may extend above the support surface S when no substrate W is loaded. When the substrate W is loaded, the substrate W contacts the support pin SP and compresses the support pin SP. By compressing the support pin SP, the friction force at location X is gradually increased, allowing the substrate W to slide over the support pin SP. When the support pin SP is fully compressed, the substrate W contacts the burls B. When the support pin SP is fully compressed, the reaction force at location X may be the same as the reaction forces at the burls B.

In an embodiment, the support pins SP have both a lower in-plane stiffness and a lower axial stiffness than the burls B.

The burls B near the edge of the support surface S may have a lower in-plane stiffness than the burls B near the center CE. For example, the burls B directly surrounding the support pins SP may have a lower in-plane stiffness than the other burls B.

In an embodiment, there is provided a substrate table to support a substrate, the substrate table comprising: a main body; burls extending from the main body and having first upper ends; and support pins having second upper ends; wherein the first upper ends define a support surface to support the substrate, wherein the support pins are movable between a retracted position, in which the second upper ends are arranged below the support surface, and an extended position in which the second upper ends extend above the support surface, wherein the support pins are arranged to support the substrate in the extended position, wherein the support pins are arranged to be switched to a first stiffness mode and a second stiffness mode, wherein, in the first stiffness mode, the support pins have a first stiffness in a direction parallel to the support surface, wherein, in the second stiffness mode, the support pins have a second stiffness in the direction parallel to the support surface, and wherein the first stiffness is different from the second stiffness.

In an embodiment, the first stiffness is larger than the second stiffness. In an embodiment, the support pins are configured to be in the first stiffness mode when the substrate is loaded on the substrate table and to be in the second stiffness mode when the substrate is unloaded from the substrate table. In an embodiment, the support pins comprise a first subset of support pins having the first stiffness in the direction parallel to the support surface and a second subset of support pins having the second stiffness in the direction parallel to the support surface. In an embodiment, the substrate table is configured to move the first subset of support pins to the extended position during loading of the substrate on the burls, while the second subset of support pins remains in the retracted position, and wherein the substrate table is configured to move the second subset of support pins to the extended position during unloading of the substrate from the burls, while the first subset of support pins remains in the retracted position. In an embodiment, at least one of the support pins comprises a piezo-element that is arranged to switch between the first stiffness mode and the second stiffness mode. In an embodiment, a friction between the first upper ends and the substrate supported on the first upper ends is larger than a friction between the second upper ends of the support pins and the substrate supported on the second upper ends. In an embodiment, the substrate table comprises loading pins having third upper ends, wherein the loading pins are movable between a further retracted position, in which the third upper ends are below the support surface, and a further extended position, in which the third upper ends extend above the support surface, wherein the support surface has a center to receive a center of a substrate, wherein the loading pins are arranged to support the substrate in the further extended position, and wherein, along a line in the support surface, the loading pins are closer to the center than the support pins. In an embodiment, a friction between the third upper ends and the substrate supported on the third upper ends is larger than a friction between the second upper ends and the substrate supported on the second upper ends. In an embodiment, the substrate table comprises a number of additional support pins arranged adjacent to one of the loading pins. In an embodiment, a stiffness of the loading pins is larger than the first stiffness and the second stiffness. In an embodiment, the support pins are arranged on a carrier device, wherein the carrier device is mounted on the main body. In an embodiment, a stiffness of the burls is larger than the first stiffness and the second stiffness. In an embodiment, the support pins are arranged to support the substrate near or at an edge of the substrate.

In an embodiment, there is provided a lithographic apparatus comprising: an illumination system configured to condition a radiation beam; a patterning device support constructed to support a patterning device, the patterning device being capable of imparting the radiation beam with a pattern in its cross-section to form a patterned radiation beam; a substrate table as described herein; and a projection system configured to project the patterned radiation beam onto a target portion of the substrate. In an embodiment, the support pins are configured to support the substrate during projection of the patterned radiation beam onto the target portion of the substrate.

A stiffness of the loading pins LP may be larger than a stiffness of the support pins SP.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

What is claimed is:

1. A substrate table to support a substrate, the substrate table comprising:
    a main body;
    burls extending from the main body and having first upper ends, the first upper ends defining a support surface to support the substrate; and
    support pins having second upper ends, the support pins being movable between a retracted position, in which the second upper ends are arranged below the support surface, and an extended position, in which the second upper ends extend above the support surface,
    wherein at least some of the support pins are arranged to support the substrate in the extended position,
    wherein the support pins are arranged to be switched to a first stiffness mode and a second stiffness mode,
    wherein, in the first stiffness mode, the at least some of the support pins have a first stiffness in a direction parallel to the support surface,
    wherein, in the second stiffness mode, the at least some of the support pins have a second stiffness in the direction parallel to the support surface,
    wherein the first stiffness is different from the second stiffness.

2. The substrate table of claim 1, wherein the first stiffness is larger than the second stiffness.

3. The substrate table of claim 1, wherein the support pins are configured to be in the first stiffness mode when the substrate is loaded on the substrate table and to be in the second stiffness mode when the substrate is unloaded from the substrate table.

4. The substrate table of claim 1, wherein the support pins comprise a first subset of support pins having the first stiffness in the direction parallel to the support surface and a second subset of support pins having the second stiffness in the direction parallel to the support surface.

5. The substrate table of claim 4, wherein the substrate table is configured to move the first subset of support pins to the extended position during loading of the substrate on the burls, while the second subset of support pins are in a retracted position from the substrate, and wherein the substrate table is configured to move the second subset of support pins to the extended position during unloading of the substrate from the burls, while the first subset of support pins are in a retracted position from the substrate.

6. The substrate table of claim 1, wherein at least one of the support pins comprises a piezo-element that is arranged to switch between the first stiffness mode and the second stiffness mode.

7. The substrate table of claim 1, wherein a friction between the first upper ends and the substrate supported on the first upper ends is larger than a friction between the second upper ends of the support pins and the substrate supported on the second upper ends.

8. The substrate table of claim 1, comprising loading pins having third upper ends,
    wherein the loading pins are movable between a further retracted position, in which the third upper ends are below the support surface, and a further extended position, in which the third upper ends extend above the support surface,
    wherein the support surface has a center to receive the substrate,
    wherein the loading pins are arranged to support the substrate in the further extended position,
    wherein, along a line in the support surface, the loading pins are closer to the center than the support pins.

9. The substrate table of claim 8, comprising a number of additional support pins arranged adjacent to one of the loading pins.

10. The substrate table of claim 8, wherein a stiffness of the loading pins is larger than the first stiffness and the second stiffness.

11. The substrate table of claim 8, wherein a friction between the third upper ends and the substrate supported on the third upper ends is larger than a friction between the second upper ends and the substrate supported on the second upper ends.

12. The substrate table of claim 1, wherein the support pins are arranged on a carrier device, wherein the carrier device is mounted on the main body.

13. The substrate table of claim 1, wherein a stiffness of the burls is larger than the first stiffness and the second stiffness.

14. The substrate table of claim 1, wherein the support pins are arranged to support the substrate near or at an edge of the substrate.

15. A lithographic apparatus comprising:
   a patterning device support constructed to support a patterning device, the patterning device being capable of imparting a radiation beam with a pattern in its cross-section to form a patterned radiation beam;
   a substrate table to support a substrate, the substrate table comprising:
      a main body;
      burls extending from the main body and having first upper ends, the first upper ends defining a support surface to support the substrate; and
      support pins having second upper ends, the support pins being movable between a retracted position, in which the second upper ends are arranged below the support surface, and an extended position, in which the second upper ends extend above the support surface,
   wherein at least some of the support pins are arranged to support the substrate in the extended position,
   wherein the support pins are arranged to be switched to a first stiffness mode and a second stiffness mode,
   wherein, in the first stiffness mode, the at least some of the support pins have a first stiffness in a direction parallel to the support surface,
   wherein, in the second stiffness mode, the at least some of the support pins have a second stiffness in the direction parallel to the support surface,
   wherein the first stiffness is different from the second stiffness; and
   a projection system configured to project the patterned radiation beam onto a target portion of the substrate.

16. The lithographic apparatus of claim 15, wherein the support pins are configured to support the substrate during projection of the patterned radiation beam onto the target portion of the substrate.

17. The lithographic apparatus of claim 15, wherein the support pins are configured to be in the first stiffness mode when the substrate is loaded on the substrate table and to be in the second stiffness mode when the substrate is unloaded from the substrate table.

18. The lithographic apparatus of claim 15, wherein the support pins comprise a first subset of support pins having the first stiffness in the direction parallel to the support surface and a second subset of support pins having the second stiffness in the direction parallel to the support surface.

19. The lithographic apparatus of claim 15, wherein at least one of the support pins comprises a piezo-element that is arranged to switch between the first stiffness mode and the second stiffness mode.

20. The lithographic apparatus of claim 15, wherein a friction between the first upper ends and the substrate supported on the first upper ends is larger than a friction between the second upper ends of the support pins and the substrate supported on the second upper ends.

* * * * *